United States Patent
Reeder

(10) Patent No.: US 7,619,411 B2
(45) Date of Patent: Nov. 17, 2009

(54) GENERALIZED METHOD FOR MRI CHEMICAL SPECIES SEPARATION USING ARBITRARY K-SPACE TRAJECTORIES

(75) Inventor: Scott Brian Reeder, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 474 days.

(21) Appl. No.: 11/678,221

(22) Filed: Feb. 23, 2007

(65) Prior Publication Data

US 2008/0048659 A1 Feb. 28, 2008

Related U.S. Application Data

(63) Continuation-in-part of application No. 11/510,896, filed on Aug. 28, 2006, now Pat. No. 7,375,522.

(51) Int. Cl.
G01V 3/00 (2006.01)
(52) U.S. Cl. .................. 324/312; 324/309
(58) Field of Classification Search ......... 324/300–322; 600/407–435
See application file for complete search history.

(56) References Cited

U.S. PATENT DOCUMENTS

| 6,856,134 | B1 | 2/2005 | Pelc et al. | |
|---|---|---|---|---|
| 7,084,626 | B2 * | 8/2006 | Ma et al. | 324/307 |
| 7,298,144 | B2 * | 11/2007 | Reeder et al. | 324/307 |
| 7,358,728 | B2 * | 4/2008 | Nozaki et al. | 324/307 |
| 7,358,729 | B2 * | 4/2008 | Ma et al. | 324/307 |
| 7,375,522 | B2 * | 5/2008 | Reeder | 324/307 |
| 2005/0085713 | A1 | 4/2005 | Reeder et al. | |
| 2005/0122105 | A1 | 6/2005 | Avram et al. | |
| 2006/0161060 | A1 * | 7/2006 | Pai | 600/431 |
| 2006/0250131 | A1 | 11/2006 | Reeder et al. | |
| 2006/0350132 | | 11/2006 | Reeder et al | |
| 2008/0001600 | A1 * | 1/2008 | deCharms | 324/309 |
| 2009/0179642 | A1 * | 7/2009 | deCharms | 324/309 |

FOREIGN PATENT DOCUMENTS

| EP | 1 574 874 A1 | 1/2005 |
|---|---|---|
| WO | 2005006008 A1 | 1/2005 |

OTHER PUBLICATIONS

PCT International Search Report.

(Continued)

*Primary Examiner*—Brij B Shrivastav
(74) *Attorney, Agent, or Firm*—Quarles & Brady LLP

(57) ABSTRACT

A method for producing images of a subject containing M spin species using a magnetic resonance imaging (MRI) system includes obtaining N k-space data matrices from N k-space data sets acquired with the MRI system using a pulse sequence with an individual associated echo time. The k-space data matrices each include corresponding data at the same plurality of k-space locations and time stamps are tracked for each k-space location. For each k-space location, a set of linear equations in k-space is solved. The set of linear equations relates corresponding data from the N k-space data matrices, echo times and time stamps to desired calculated k-space data. Calculated data in k-space which is corrected for chemical shift is produced corresponding to each k-space location and aggregated to obtain a k-space calculated data set. The k-space calculated data set is transformed to image space to obtain a corresponding image.

35 Claims, 8 Drawing Sheets

OTHER PUBLICATIONS

Scott B. Reeder et al, Multicoil Dixon Chemical Species Separation With an Iterative Least-Squares Estimation Method, Magnetic Resonance in Mecidine 51:35-45-(2004).

T. Tuthill et al, MRI Quantification of Liver Fat in an Obese Population, Proc. Intl. Soc. Mag. Reson. Med. 14 2295 (2006).

Scott B. Reeder et al, Generalized Method For MRI Chemical Species Separation Using Arbitrary k-space Trajectories with Improved Chemical Shift Artifact Correction, invention disclosure to WARF Dec. 30, 2006, 126 pages.

* cited by examiner

US 7,619,411 B2

GENERALIZED METHOD FOR MRI CHEMICAL SPECIES SEPARATION USING ARBITRARY K-SPACE TRAJECTORIES

CROSS REFERENCE TO RELATED APPLICATIONS

This patent application is a continuation-in-part of U.S. patent application Ser. No. 11/510,896, filed Aug. 28, 2006, now U.S. Pat. No. 7,375,522 titled "Method for Aligning Multiple MR Images Acquired With Alternating Readout Gradient", which is incorporated herein by reference.

FIELD OF THE INVENTION

The field of the invention is nuclear magnetic resonance imaging ("MRI") methods and systems. More particularly, the invention relates to the reconstruction of images of multiple, chemical shifted spin species or species combinations.

BACKGROUND OF THE INVENTION

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, Mz, may be rotated, or "tipped", into the x-y plane to produce a net transverse magnetic moment Mt. A signal is emitted by the excited spins after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Various embodiments of the present invention will be described in detail with reference to a variant of the well known Fourier transform (FT) imaging technique, which is frequently referred to as "spin-warp" and results in Cartesian k-space sampling. The spin-warp technique is well-known and employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then an NMR signal is acquired in the presence of a readout magnetic field gradient ($G_x$) in a direction orthogonal to the phase encoding direction. The readout gradient present during the acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed.

In an NMR imaging sequence, a uniform magnetic field $B_0$ is applied to an imaged object along the z axis of a Cartesian coordinate system. The effect of the magnetic field $B_0$ is to align the object's nuclear spins along the z axis. In this field, the nuclei resonate at their Larmor frequencies according to $\omega = \gamma B_0$, where $\omega$ is the Larmor frequency, and $\gamma$ is the gyromagnetic ratio which is a property of the particular nucleus.

The nuclei respond to RF pulses at this frequency by tipping their longitudinal magnetization into the transverse, x-y plane. Water, because of its relative abundance in biological tissue and the properties of its proton nuclei, is of principle concern in such imaging. The value of the gyromagnetic ratio $\gamma$ for protons in water is 4.26 kHz/Gauss and therefore in a 1.5 Tesla polarizing magnetic field $B_0$, the resonant or Larmor frequency of water protons is approximately 63.9 MHz.

Materials other than water, principally fat, are also to be found in biological tissue and have different gyromagnetic ratios. The Larmor frequency of protons in fat is approximately 210 Hz lower than that of protons in water in a 1.5 Tesla polarizing magnetic field $B_0$. The difference between the Larmor frequencies of such different isotopes or species of the same nucleus, viz., protons, is termed chemical shift, reflecting the differing chemical environments of the two species.

In the well known slice selective RF pulse sequence, a slice select magnetic field gradient $G_z$ is applied at the time of the RF pulse so that only the nuclei in a slice through the object in an x-y plane are excited. After the excitation of the nuclei, magnetic field gradients are applied along the x and y axes and an NMR signal is acquired. The readout gradient $G_x$ along the x axis causes the nuclei to precess at different resonant frequencies depending on their position along the x axis; that is, $G_x$ spatially encodes the precessing nuclei by frequency. But because water and fat spins resonate at different frequencies, even when they are in the same location, their locations in the reconstructed image will be shifted with respect to each other. This is particularly problematic on the boundaries of tissues or organs where this chemical shift can cause blurring or multiple edges.

There is a large body of art that has been developed to suppress the signals from either water or fat. Reliable and uniform fat suppression is essential for accurate diagnoses in many areas of MRI. This is particularly true for sequences such as fast spin-echo (FSE), steady-state free precession (SSFP) and gradient echo (GRE) imaging, in which fat is bright and may obscure underling pathology. Although conventional fat saturation may be adequate for areas of the body with a relative homogeneous $B_0$ field, there are applications in which fat saturation routinely fails. This is particularly true for extremity imaging, off-isocenter imaging, large field of view (FOV) imaging, and challenging areas such as the brachial plexus and skull based, as well as many others. Short-TI inversion recovery (STIR) imaging provides uniform fat suppression, but at a cost of reduced signal-to-noise ratio (SNR) for the water image and mixed contrast that is dependent on $T_1$, (Bydder G M, Pennock J M, Steiner R E, Khenia S, Payne J A, Young I R, The Short T1 Inversion Recovery Sequence—An Approach To MR Imaging Of The Abdomen, Magn. Reson. Imaging 1985; 3(3):251-254). This latter disadvantage limits STIR imaging to $T_2$ weighted ($T_2W$) applications, such that current $T_1$ weighted ($T_1W$) applications rely solely on conventional fat-saturation methods. Another fat suppression technique is the use of spectral-spatial or water selective pulses; however, this method is also sensitive to field inhomogeneities, (Meyer C H, Pauly J M, Macovski A, Nishimura D G, Simultaneous Spatial And Spectral Selective Excitation, Magn. Reson. Med. 1990; 15(2):287-304).

A water and fat separation technique, "In and Out of Phase" Imaging was first described by Dixon in 1984, and is used to exploit the difference in chemical shifts between water and fat in order to separate water and fat into separate images, Dixon W. Simple Proton Spectroscopic Imaging, Radiology 1984; 153:189-194. Glover et al further refined this approach in 1991 with a 3 point method that accounts for magnetic field inhomogeneities created by susceptibility differences, Glover G H, Schneider E, Three-Point Dixon Technique For True Water/Fat Decomposition With B0 Inhomogeneity Correction, Magn. Reson. Med. 1991; 18(2):371-383; Glover G, Multipoint Dixon Technique For Water and Fat Proton and Susceptibility Imaging, Journal of Magnetic Resonance Imaging 1991; 1:521-530. Hardy et al first applied this method with FSE imaging by acquiring three images with the readout centered at the spin-echo for one image and symmetrically before and after the spin-echo in the subsequent two images, Hardy P A, Hinks R S, Tkach J A, Separation Of Fat And Water In Fast Spin-Echo MR Imaging With The Three-Point Dixon Technique, J. Magn. Reson. Imaging 1995; 5(2):181-195.

Recently, Jingfei Ma described an improvement on the original two point technique described by Dixon, Ma J. Breath-Hold Water And Fat Imaging Using A Dual-Echo Two-Point Dixon Technique With an Efficient And Robust Phase-Correction Algorithm, Magn. Reson, Med. 2004; 52(2):415-419. In this method, two echoes that are in-phase and out-of-phase are acquired, just as in the original description by Dixon, but an upwrapping algorithm is used to unwrap ambiguities between water and fat, to remove water-fat "swapping" that can occur in the presence of field inhomogeneities. This method has also been extended to a 3D-SPGR acquisition where the two readouts are acquired in the same pulse sequence, or TR, with the readout gradients having opposite polarity, Ma J, Vu A, Son J, Choi H, Hazle J, Fat-Suppressed Three-Dimensional Dual Echo Dixon Technique For contrast Agent Enhanced MRI, J. Magn. Reson. Imag. 2006; 23:36-41. This water-fat separation appears to work well, but it is important to note that high bandwidths are used such that chemical shift artifacts may be problematic for this approach at lower bandwidths. It is very advantageous to image with lower bandwidths; to acquire images with higher signal to noise ratio (SNR), improving the quality of the images. Limited SNR also results in limited resolution. Further work by Ma, such as that presented at the 2006 ISMRM describes a three-echo method that uses alternating polarity gradients. However, the images presented in this work show clear evidence of the effects of chemical shift artifact related to the alternating readout gradient polarity.

It has been observed that when multiple images are acquired during a single pulse sequence, or TR, using a readout gradient of alternating polarity, that the images are not spatially aligned with each other as a result of chemical shift artifact. As a result, when the images are combined using one of the above described methods, artifacts such as blurring or double edges occur at the boundaries of tissues and organs even in images that depict only water or fat spin density. This artifact is particularly troublesome at higher $B_0$ field strengths where chemical shift is larger or when the receiver bandwidth is reduced in order to improve the signal to noise ratio (SNR).

Also recently, a water-fat separation method known as IDEAL (Iterative Decomposition of water and fat with Echo Asymmetry and Least squares estimation) has been described by Reeder S, Pineda A, Wen Z, et al., in Iterative Decomposition of Water and Fat With Echo Asymmetry and Least-Squares Estimation (IDEAL): Application with Fast Spin-echo Imaging, Magn Reson Med 2005; 54(3):636-644. IDEAL is an SNR-efficient method that uses flexible echo spacings and when combined with optimized echo spacings can provide the best possible SNR performance. In addition, IDEAL can easily be extended to systems with multiple species such as C-13 labeled pyruvate. Reeder S, Bittain J, Grist T, Yen Y, "Separation of C-13 Metabolites with Chemical Shift Imaging", 2006; The International Society of Magnetic Resonance 14th Meeting.

Others have combined water-fat separation methods with non-spin-warp imaging, including spiral imaging and 3D-projection reconstruction (VIPR). In spiral imaging, chemical shift results in blurring of the image. Simply separating the water and fat signals will not remove this blur. Correction for blurring from off-resonance fat shifts in spiral imaging have been reported, but are image-based and computationally intensive. A simpler method is needed to remove the effects of the fat phase shifts that lead to blur.

SUMMARY OF THE INVENTION

One aspect of the present invention stems from the discovery of the cause of image artifacts and includes a chemical shift correction step performed in k-space. Referring to FIG. 6(a), consider the phase of fat in a spin-warp k-space trajectory for lines of k-space from three different images at different echo times $t_1$, $t_2$, and $t_3$. For the spin-warp acquisition, all echoes have the same slope of the phase roll, and therefore, the fat will be shifted by the same amount in all three images. Although this shift is an artifact, it is a relatively tolerable artifact, and the fact that all three images have the same shift means that the fat in the three source images used for water-fat decomposition (using IDEAL for example) will be aligned. After water-fat separation, the entire fat image can be shifted to realign the fat and water images to remove the effect of the chemical shift.

Now consider an echo-planar acquisition where the polarity of the readout gradient alternates and the trajectory in k-space rasters back and forth in the $k_x$ readout direction such as is illustrated in FIG. 6(b). In this situation, the slope of the phase evolution of fat is opposite for consecutive echoes. Each echo is used to construct a source image at different effective echo times, $t_1$, $t_2$, and $t_3$. Therefore, the chemical shift artifact in the readout direction will be opposite for consecutive source images, and the fat from images acquired with different polarity readout gradients will be misaligned. Thus, it is not possible to separate water and fat using misaligned source images, without introducing image artifacts.

One object of the present invention is to accurately correct for chemical shift errors that occur when images of two different spin species are acquired with readout gradients of opposite polarity. Another object of the invention is to produce water and fat images that are fully corrected for chemical shift errors that are produced when the NMR signals for the two images are acquired with readout gradients of opposite polarity.

Consider a two point acquisition with alternating readout gradients used to acquire a plurality of k-space data sets, with one image in-phase and the second image out-of-phase. The k-space data set for the first image $s_0(x,y)$ is acquired with the readout from left to right (i.e., positive readout gradient), and the k-space data set for the second image $s_1(x,y)$ is acquired with the readout from right to left (i.e., negative readout gradient). The two reconstructed, real space images can be written, $$s_0(x,y)=(w(x,y)+f(x-\Delta x,y))e^{i\phi_0} \quad (1)$$

and $$s_1(x,y)=(w(x,y)-f(x+\Delta x,y))e^{i(\phi_0+\Delta\phi)} \quad (2)$$

where w(x,y) and f(x,y) are the signals associated with water and fat spins, $\phi_0$ is a constant phase term, resulting from coil sensitivities and other causes. $\Delta\phi$ is the increment in-phase due to field inhomogeneities or other time dependent field inhomogeneities. In addition, there may be phase shifts that result from gradient polarity reversals and timing mismatches that are embodied in the phase shift $\Delta\phi$.

$\Delta x$ is the chemical shift. If the scanner center frequency is set to water, the fat in these reconstructed images will be shifted by a small amount in the readout direction when the readout gradient is positive, and by the same amount in the opposite direction when the readout gradient is reversed. The chemical shift (in pixels) between fat signals in the two images is:

$$\Delta x = \frac{N_x \Delta f}{2BW} \quad (3)$$

where BW is readout bandwidth, typically ±20-125 kHz, $N_x$ is the number of k-space samples in the readout matrix and $\Delta f$ is the chemical shift between water and fat, about −210 Hz at 1.5 T. In the discussion below all of the chemical shift is attributed to fat because the system center frequency is tuned to water. The chemical shift can be shifted to water by changing the rf center frequency or it can be set to some value between water and fat.

The phase $\phi_0$ is removed by dividing out the phase of equation (1) from both the signals of equation (1) and (2) such that, $$s_0'(x,y) = (w(x,y) + f(x - \Delta x, y)) \quad (4)$$

and $$s_1'(x,y) = (w(x,y) - f(x + \Delta x, y)) e^{i\Delta\phi(x,y)} \quad (5)$$

where $\Delta x$ is the chemical shift measured in pixels.

If the phase map $e^{i\Delta\phi(x,y)}$ is known, it can be demodulated from the second image of equation (5), and w(x,y) and f(x,y) can easily be determined. In general, we do not know $\Delta\phi(x,y)$, although we can remove its effect by taking the magnitude of equation (5). This leads to a natural ambiguity, depending on whether the pixel is water dominant (w(x,y)>f(x,y)) or fat dominant (f(x,y)<w(x,y)).

A phase unwrapping algorithm such as that described in the above-cited Jingfei Ma reference is used to resolve this ambiguity. A correct solution for the magnitude and sign of each pixel in the image $s_1'(x,y)$ yields:

$$s_1''(x,y) = \pm|w(x,y) - f(x + \Delta x, y)|. \quad (6)$$

If we take the Fourier transformation of the resulting two images of equations (4) and (6), we have the corresponding k-space data sets:

$$S_0 = FT\{s_0'(x,y)\} = W(k_x, k_y) + F(k_x, k_y) e^{i\Delta x \Delta X k_x} \quad (7)$$

and $$S_1 = FT\{s_1''(x,y)\} = W(k_x, k_y) - F(k_x, k_y) e^{-i\Delta x \Delta X k_x}. \quad (8)$$

From these k-space data sets and noting that $\Delta X = FOV/N_x$ is the pixel dimension (cm), and k-space is sampled from $-k_x^{max}$ to $+k_x^{max}$, with $k_x^{max} = \pi/\Delta X$, we can calculate separate water and fat k-space data sets $W(k_x, k_y)$ and $F(k_x, k_y)$ as, $$W(k_x, k_y) = \frac{S_0 e^{-i\Delta x \Delta X k_x} + S_1 e^{i\Delta x \Delta X k_x}}{e^{-i\Delta x \Delta X k_x} + e^{i\Delta x \Delta X k_x}}$$
$$= \frac{S_0 e^{-i\Delta x \Delta X k_x} + S_1 e^{i\Delta x \Delta X k_x}}{2\cos(\Delta x \Delta X k_x)} \quad (9)$$

and $$F(k_x, k_y) = \frac{S_0 e^{-i\Delta x \Delta X k_x} - S_1 e^{i\Delta x \Delta X k_x}}{2} + W\frac{(e^{-i\Delta x \Delta X k_x} - e^{i\Delta x \Delta X k_x})}{2}$$
$$= \frac{S_0 - S_1}{2\cos(\Delta x \Delta X k_x)}. \quad (10)$$

Note that the denominator will never be zero so long as $\Delta x \neq N_x$ and $$k_x = \Delta k(n_x + 1/2), n = \left[\frac{-N_x}{2}, \frac{N_x - 1}{2}\right].$$

Finally, the water image (w(x,y)) and fat image (f(x,y)) are reconstructed by calculating the inverse Fourier transformation of these k-space data sets of equations (9) and (10). Note that if $\Delta x$ is very small (zero), equations (9) and (10) reduce to the expected solutions, $$W = \frac{S_0 + S_1}{2} \quad (11)$$

and $$F = \frac{S_0 - S_1}{2}. \quad (12)$$

Another aspect of the present invention is the recognition that these same or similar principles can be applied to spiral, projection reconstruction and other non-spin-warp (non-Cartesian coordinate) k-space trajectories. Thus, another important aspect of the present invention is a generalized method for correcting for chemical shift artifacts in k-space which allows for k-space data to be obtained using various k-space trajectories.

In particular, the generalized method includes acquiring N k-space data sets with the MRI system, with each data set acquired using a pulse sequence having an individual associated echo time $t_n$. A time stamp $\tau_{k,n}$ is tracked for each k-space location for which data is acquired, with the time stamp being indicative of data acquisition time relative to a reference, such as the time from the center of k-space to when the data is acquired for that particular k-space location. The acquired k-space data sets are regridded if necessary (e.g., if non-Cartesian k-space trajectories are used in the acquisition) using conventional regridding techniques so that N k-space matrices are obtained, each including corresponding data at the same plurality of Cartesian k-space locations. The acquired time stamp data are also regridded if necessary. A system of linear equations in k-space is formulated that relates, at each Cartesian k-space location, data corresponding to that same k-space location from the N obtained k-space data matrices, echo times, and time stamps to desired calculated k-space data. For each Cartesian k-space location, the system of linear equations in k-space is solved to obtain the desired calculated k-space data, and the k-space calculated data from all the k-space locations is aggregated to obtain one or more calculated k-space data sets. For example, a system of linear equations can be formulated such that the calculated k-space data sets produced are separate species k-space data sets such that chemical species such as water and fat are separated from one another. In other embodiments, in-phase or out-of-phase species combination k-space data sets can be calculated. Further, the system of linear equations can be formulated such that chemical species with multiple peaks can be separated. The calculated k-space data set is transformed to image space to obtain one or more corresponding images, such as separate species images, in-phase or out-of-phase images, or the like.

More particularly, a signal acquired at a point in k-space corresponding to an image n can be represented by:

$$S_n(\tau_{k,n}, k) = \sum_{m=1}^{M} \rho_m e^{i 2\pi \Delta f_m (t_n + \tau_{k,n})} \quad (13)$$

where:

k represents a specific location in k-space;

n represents a selected one of N separately acquired k-space data sets;

$\tau_{k,n}$ is a time stamp defined by the time from the center of k-space to when data corresponding to a particular location k of a particular data set n is acquired;

m represents one of the M chemical species in the sample;

$\rho_m$ is the signal due to an individual species m;

$\Delta f_m$ is the chemical shift (relative to the MRI system receive frequency) of species m; and $t_n$ is the echo time when the center of k-space for k-space data set n is acquired.

Thus, the time stamp is an indication of data acquisition time relative to a reference, and the additional subscript n is included in $\tau_{k,n}$ to explicitly recognize that the k-space trajectory (and therefore the time from the center of k-space) may be different for different echo numbers. For example, with a pulse sequence including an alternating gradient readout polarity (EPI readout), the time from the center of k-space to the same point in k-space for two different echoes may be different. Conversely, for acquisitions with a single echo per TR (pulse sequence repetition period) and a bulk shift of the readout (tn), the relative time for the center of k-space at which each point is acquired will be the same for all images, i.e., will be independent of n. For non-Cartesian coordinate acquisitions such as spiral, PR, etc., it is important to note that $\tau_{k,n}$ is effectively a scalar field. This scalar field can also be regridded, as explained more fully below.

Equation (13), which disregards the effects of field inhomogeneities, can be expressed as follows:

$$S_n(\tau_{k,n}, k) = \sum_{m=1}^{M} \rho_m e^{i 2\pi \Delta f_m (t_n + \tau_{k,n})} = \sum_{m=1}^{M} \rho_m c_{mn} d_{mn}(k) \quad (14)$$

where:

$$c_{mn} = e^{i 2\pi \Delta f_m t_n}; \text{ and} \quad (14a)$$

$$d_{mn}(k) = e^{i 2\pi \Delta f_m \tau_{k,n}} \quad (14b)$$

Note that the phase shift at the center of k-space due to the echo time, $c_n$, is independent of position in k-space. The term $d_{mn}(k)$ contains phase shifts in the k-space data that result in chemical shift artifacts (shift, misregistration, blurring). Assume that for a given source image, all echoes are acquired at the center of k-space with the same time, i.e., echoes with different echo times are not combined in the same image.

Equation (14) represents a system of linear equations. Provided that a sufficient number of k-space data sets are acquired, i.e., N must be greater than or equal to M, then estimates of the signals $\rho_m$ for each of the M chemical species at a k-space location can be made by solving equation (14), such as by using a pseudo-inverse operation. The pseudo inverse is a maximum likelihood estimator for a system and provides a solution to a system of linear equations, as follows:

$$\hat{\tau} = (A_{k,n}{}^H A_{k,n})^{-1} A_{k,n}{}^H S_k \quad (15)$$

where:

the superscript H represents the Hermitian transpose;

$$\rho = [\rho_1 \quad \rho_2 \quad \cdots \quad \rho_M]; \quad (15a)$$

$$S_k = \begin{bmatrix} s_1 \\ s_2 \\ \vdots \\ s_N \end{bmatrix}; \quad (15b)$$

and $$\begin{vmatrix} c_{11}d_{11}(k) & c_{21}d_{21}(k) & \cdots & c_{M1}d_{M1}(k) \\ c_{12}d_{12}(k) & c_{22}d_{22}(k) & \cdots & c_{M2}d_{M2}(k) \\ \cdots & \cdots & \cdots & \cdots \\ c_{1N}d_{1N}(k) & c_{2N}d_{2N}(k) & \cdots & c_{MN}d_{MN}(k) \end{vmatrix} \quad (15c)$$

Equation (15c) can be simplified depending on the pulse sequence used to acquire the k-space data sets. For example, if $d_{mn}(k)$ does not depend on the echo number, i.e., $d_m(k)$, which would occur in a single echo/TR pulse sequence or a pulse sequence with echo planar readout with fly-back gradients, i.e., identical k-space trajectories for each echo, but with different bulk echo shifts, $t_n$, then equation (15c) can be expressed as follows:

$$A_{k,n} = \begin{vmatrix} c_{11}d_1(k) & c_{21}d_2(k) & \cdots & c_{M1}d_M(k) \\ c_{12}d_1(k) & c_{22}d_2(k) & \cdots & c_{M2}d_M(k) \\ \cdots & \cdots & \cdots & \cdots \\ c_{1N}d_1(k) & c_{2N}d_2(k) & \cdots & c_{MN}d_M(k) \end{vmatrix} = AD \quad (16)$$

where:

$$A = \begin{vmatrix} c_{11} & c_{21} & \cdots & c_{M1} \\ c_{12} & c_{22} & \cdots & c_{M2} \\ \cdots & \cdots & \cdots & \cdots \\ c_{1N} & c_{2N} & \cdots & c_{MN} \end{vmatrix} \quad (16a)$$

and $$D = \begin{vmatrix} d_1 & 0 & \cdots & 0 \\ 0 & d_2 & \cdots & 0 \\ \cdots & \cdots & \cdots & \cdots \\ 0 & 0 & \cdots & d_M \end{vmatrix} \quad (16b)$$

Note that A is the same matrix used for conventional IDEAL, and is independent of position in k-space. Further, D is a matrix which is dependent on the position in k-space. It is easy to show that since $A_{k,n} = AD$, then the pseudo-inverse (denoted as a superscript "†") of $A_{k,n}$ can be represented as follows:

$$A_{k,n}{}^\dagger = (AD)^\dagger = D^\dagger A^\dagger \quad (17)$$

In such a case, equation (15) can be simplified to:

$$\hat{\rho} = D^H (A^H A)^{-1} A^H S_k \quad (18)$$

Noting that the term $(A^H A)^{-1} A^H$ is independent of position in k-space, it only needs to be computed once. The matrix $D^H$ will be different for every position in k-space, but is a simple diagonal matrix, and therefore, computation of Equation (18) is very computationally efficient.

Thus, using the above equation (15), or simplifications thereof, estimates of the signal in k-space attributable to each different chemical species can be made for all the k-space locations. Then, an inverse Fourier transform on the full k-space data sets for each chemical species can be performed to obtain separate images for each species, free from the blurring or shifting effects of chemical shift.

In the simplified case with two chemical species such as water (W) and fat (F), and with the receive frequency of the MRI system being set to the water frequency, equation (14) can be written as follows:

$$S_n(\tau_{k,n},k) = w(k) + f(k)e^{i2\pi\Delta f_m(t_n+\tau_{k,n})} \quad (19)$$

Then the $A_{k,n}$ matrix can be expressed as:

$$A_{k,n} = \begin{vmatrix} d_{11}(k) & c_{21}d_{21}(k) \\ d_{12}(k) & c_{22}d_{22}(k) \\ \dots & \dots \\ d_{1N}(k) & c_{2N}d_{2N}(k) \end{vmatrix} = \begin{vmatrix} 1 & c_{21}d_{21}(k) \\ 1 & c_{22}d_{22}(k) \\ \dots & \dots \\ 1 & c_{2N}d_{2N}(k) \end{vmatrix} \quad (20)$$

Note that the $c_{1n}(k)$ and $d_{1n}(k)$ terms equal one because $\Delta f_w$ equals zero.

This can be further simplified if a pulse sequence is used to acquire the N k-space data sets wherein the k-space trajectories are the same for all of the n echoes (such as single echo/TR or EPI with flyback readouts), according to equation (18) above with:

$$A = \begin{vmatrix} 1 & e^{i2\pi\Delta f_m(t_1)} \\ 1 & e^{i2\pi\Delta f_m(t_2)} \\ \dots & \dots \\ 1 & e^{i2\pi\Delta f_m(t_n)} \end{vmatrix} \quad (21)$$

$$D^H = \begin{vmatrix} 1 & 0 \\ 0 & e^{i2\pi\Delta f_m(\tau_k)} \end{vmatrix} \quad (22)$$

Here again, $t_n$ is the echo time and $\tau_k$ is the time relative to the echo time $t_n$ when each point in k-space was acquired. Note that $\tau_k$ is independent of the echo number, i.e., it is the same for all the images. For a Cartesian acquisition, this would be equivalent to applying a phase roll on the fat along the direction of the readout.

Another object of the invention is to extend the above k-space formulations to develop a generalized system of linear equations in k-space which can be used to calculate in-phase (W+F) images and/or out-of-phase (W−F) images, and/or other species combination images. These in-phase (IP) and out-of-phase (OP) images are a convenient clinical tool for visualization of microscopic fatty infiltration of tissue in various applications. For example, such images can provide important information regarding hepatic steatosis or adrenal adenomas. Using spin-warp imaging, there will be a simple misregistration (shift) of the entire fat image relative to the water image. Conventionally, a sinc interpolation is performed on the fat image to realign it with the water image before calculating recombined images that are free of chemical shift artifact:

1. IP=abs(W)+abs(F)
2. OP=abs(abs(W)−abs(F))

However, a generalized system of linear equations in k-space as set forth below allows for direct estimates of recombined W+F and W−F images and may offer improved SNR performance over recombining images in image space as conventionally done. Specifically, estimates of k-space for IP data can be obtained by rewriting equation (19) as follows:

$$S_n(\tau_{k,n},k) = (w(k)+f(k)) + f(k)(e^{i2\pi\Delta f_m(t_n+\tau_{k,n})} - 1)$$

$$S_n(\tau_{k,n},k) = ip(k) + f(k)(e^{i2\pi\Delta f_m(t_n+\tau_{k,n})} - 1) \quad (23)$$

In this manner, the $A_{k,n}$ matrix becomes:

$$A_{k,n} = \begin{vmatrix} 1 & (e^{i2\pi\Delta f_m(t_1+\tau_{k,1})} - 1) \\ 1 & (e^{i2\pi\Delta f_m(t_2+\tau_{k,2})} - 1) \\ \dots & \dots \\ 1 & (e^{i2\pi\Delta f_m(t_n+\tau_{k,n})} - 1) \end{vmatrix} \quad (23a)$$

The $A_{k,n}$ matrix can be separated into matrixes A and D in a manner similar to that discussed previously.

Similarly, for OP estimates the signal model becomes:

$$S_n(\tau_{k,n},k) = (w(k)-f(k)) + f(k)(e^{i2\pi\Delta f_m(t_n+\tau_{k,n})} + 1)$$

$$S_n(\tau_{k,n},k) = op(k) + f(k)(e^{i2\pi\Delta f_m(t_n+\tau_{k,n})} + 1) \quad (24)$$

Here the $A_{k,n}$ matrix becomes:

$$A_{k,n} = \begin{vmatrix} 1 & (e^{i2\pi\Delta f_m(t_1+\tau_{k,1})} + 1) \\ 1 & (e^{i2\pi\Delta f_m(t_2+\tau_{k,2})} + 1) \\ \dots & \dots \\ 1 & (e^{i2\pi\Delta f_m(t_n+\tau_{k,n})} + 1) \end{vmatrix} \quad (24a)$$

A chemical shift correction method using a system of linear equations in k-space can also be applied to the separation of species such as the different metabolites of $^{13}C$ labeled pyruvate, in which one or more species has more than one resonant peak. See FIG. 7(a), which shows a schematic of biochemical pathways of labeled pyruvate in both aerobic and anaerobic respiration and FIG. 7(b), illustrating the $^{13}C$ spectrum for various components at a polarizing field of 3 T.

In prior work, an image based formulation is used whereby the total signal from the two peaks (pyruvate and pyruvate ester) are recombined in the estimation process, using the assumption that the relative signal proportions are fixed and known a priori. However, one of the major limitations of an image based formulation is that the misregistration in the readout direction due to chemical shift artifact (using a spin-warp acquisition) is different for the two pyruvate peaks. Thus, an image based method is unable to adequately correct for chemical shift artifact using the image based method that is used for water and fat. Therefore, the final pyruvate image, which is an estimated combination of the main pyruvate peak and the pyruvate ester peak, will have its two components incorrectly aligned. Except at very high bandwidths where misregistration is small, this will lead to image artifacts in the final pyruvate image.

A k-space based formulation will remove the effects of chemical shift artifact for decomposition of systems with chemical species that have more than one resonant peak. The following example uses the case of pyruvate labeled with $^{13}C$ at the 1-C position but can also be extended to other groups of chemical species, including fat which may have multiple peaks depending on the type of fat.

Again ignoring the effects of the field inhomogeneity map (or assuming that the effects have previously been removed), the total signal of a voxel containing $^{13}C$ labeled pyruvate has contributions from pyruvate (Pyr), pyruvate ester (PE), alanine (A) and lactate (L). A schematic spectrum of these metabolites at 3 T is shown in FIG. 7(b). The signal model in k-space for this system can be written:

$$S_n(\tau_{k,n},k) = \rho_L(e^{i2\pi\Delta f_L(t_n+\tau_{k,n})}) + \rho_A(e^{i2\pi\Delta f_A(t_n+\tau_{k,n})}) + \rho_P$$
$$(r_{PE}e^{i2\pi\Delta f_{PE}(t_n+\tau_{k,n})} + r_{Pyr}e^{i2\pi\Delta f_{Pyr}(t_n+\tau_{k,n})}) \quad (25)$$

where the phasor terms containing $\tau_{k,n}$ represent the phase shifts in k-space on each species due to chemical shift due to the time evolution of phase, relative to the center of k-space, which is sampled at time $t_n$ for the nth source image. Further, $\rho_L$, $\rho_A$, and $\rho_P$ are the total signal contributions in k-space from lactate, alanine, and pyruvate respectively, while $\Delta f_L$, $\Delta f_A$, $\Delta f_{Pyr}$, and $\Delta f_{PE}$ are the resonant frequencies of lactate, alanine, the main pyruvate peak and the pyruvate ester peak with respect to the receiver frequency, and $r_{PE}$ and $r_{Pyr}$ are the relative fractions of the total signal from the two pyruvate peaks, such that their sum equals 1.

Estimates of $\rho_L$, $\rho_A$, and $\rho_P$ can be made in the usual way, using the pseudo-inverse, where the $A_{k,n}$ matrix is as follows:

$$A_{k,n} = \begin{bmatrix} c_1^A d_1^A & c_1^L d_1^L & (r_{PE} c_1^{PE} d_1^{PE} + r_{Pyr} c_1^{Pyr} d_1^{Pyr}) \\ c_2^A d_2^A & c_2^L d_2^L & (r_{PE} c_2^{PE} d_2^{PE} + r_{Pyr} c_2^{Pyr} d_2^{Pyr}) \\ \ldots & \ldots & \ldots \\ c_N^A d_N^A & c_N^L d_N^L & (r_{PE} c_N^{PE} d_N^{PE} + r_{Pyr} c_N^{Pyr} d_N^{Pyr}) \end{bmatrix} \quad (25a)$$

where $$c_n^A = e^{i2\pi \Delta f_A t_n}; c_n^L = e^{i2\pi \Delta f_L t_n}; \quad (25b)$$
$$c_n^{PE} = e^{i2\pi \Delta f_{PE} t_n}; \text{ and } c_n^{Pyr} = e^{i2\pi \Delta f_{Pyr} t_n}$$

which are independent of position in k-space, and $$d_n^A = e^{i2\pi \Delta f_A \tau_{k,n}}; d_n^L = e^{i2\pi \Delta f_L \tau_{k,n}}; d_n^{PE} = e^{i2\pi \Delta f_{PE} \tau_{k,n}}; \text{ and}$$
$$d_n^{Pyr} = e^{i2\pi \Delta f_{Pyr} \tau_{k,n}} \quad (25c)$$

which are dependent on k-space position.

In the special but important case where all k-space trajectories are the same for all echoes (e.g., single echo/TR with a simple shift in the echo time $t_n$, or EPI with flyback readout gradients), the k-space dependent phase shifts ($d_n$ phasor terms) will also be independent of echo number n, i.e., will be the same for all n source data sets. The $A_{k,n}$ matrix can then be simplified in a similar manner to that described above.

The foregoing and other objects and advantages of the invention will appear from the following description. In the description, reference is made to the accompanying drawings which form a part hereof, and in which there is shown by way of illustration various embodiments of the invention. These embodiments do not necessarily represent the full scope of the invention, however, and reference is made therefore to the claims and herein for interpreting the scope of the invention.

DESCRIPTION OF THE PREFERRED EMBODIMENT

Figure 1:
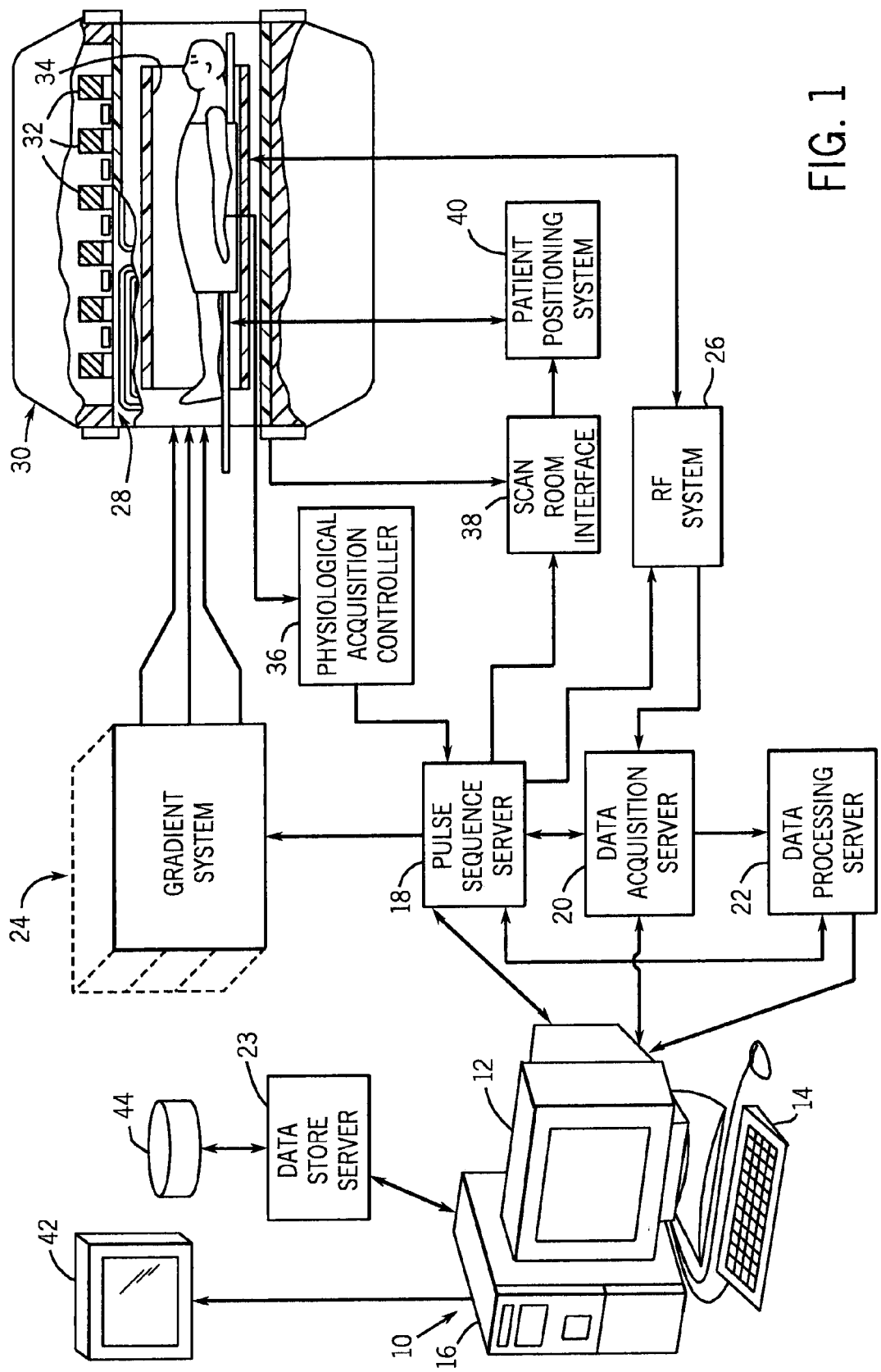
FIG. 1 is a block diagram of an MRI system which employs the present invention.

Referring particularly to FIG. 1, the various embodiments of the invention are employed in an MRI system. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22, and a data store server 23. In the preferred embodiment the data store server 23 is performed by the workstation processor 16 and associated disc drive interface circuitry. The remaining three servers 18, 20 and 22 are performed by separate processors mounted in a single enclosure and interconnected using a 64-bit backplane bus. The pulse sequence server 18 employs a commercially available microprocessor and a commercially available quad communication controller. The data acquisition server 20 and data processing server 22 both employ the same commercially available microprocessor and the data processing server 22 further includes one or more array processors based on commercially available parallel vector processors.

The workstation 10 and each processor for the servers 18, 20 and 22 are connected to a serial communications network. This serial network conveys data that is downloaded to the servers 18, 20 and 22 from the workstation 10 and it conveys tag data that is communicated between the servers and between the workstation and the servers. In addition, a high speed data link is provided between the data processing server 22 and the workstation 10 in order to convey image data to the data store server 23.

The pulse sequence server 18 functions in response to program elements downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$, and $G_z$ used for position encoding NMR signals. The gradient coil assembly 28 forms part of a magnet assembly 30 which includes a polarizing magnet 32 and a whole-body RF coil 34.

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays.

The RF system 26 also includes one or more RF receiver channels. Each RF receiver channel includes an RF amplifier that amplifies the NMR signal received by the coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M=\sqrt{I^2+Q^2},$$

and the phase of the received NMR signal may also be determined:

$$\Phi=\tan^{-1}Q/I.$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

It should be apparent that the pulse sequence server 18 performs real-time control of MRI system elements during a scan. As a result, it is necessary that its hardware elements be operated with program instructions that are executed in a timely manner by run-time programs. The description components for a scan prescription are downloaded from the workstation 10 in the form of objects. The pulse sequence server 18 contains programs which receive these objects and converts them to objects that are employed by the run-time programs.

The digitized NMR signal samples produced by the RF system 26 are received by the data acquisition server 20. The data acquisition server 20 operates in response to description components downloaded from the workstation 10 to receive the real-time NMR data and provide buffer storage such that no data is lost by data overrun. In some scans the data acquisition server 20 does little more than pass the acquired NMR data to the data processor server 22. However, in scans which require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process NMR signals used to detect the arrival of contrast agent in an MRA scan. In all these examples the data acquisition server 20 acquires NMR data and processes it in real-time to produce information which is used to control the scan.

The data processing server 22 receives NMR data from the data acquisition server 20 and processes it in accordance with description components downloaded from the workstation 10. Such processing may include, for example: transformation of raw k-space NMR data to produce two or three-dimensional images, typically performed using an inverse Fourier transformation; transformation of image space data to produce k-space data, typically performed using a Fourier transformation, the application of filters to a reconstructed image; the performance of a backprojection image reconstruction of acquired NMR data; the calculation of functional MR images; the calculation of motion or flow images, etc. As will be described below, the present invention is preferably embodied in software executed by the data processing server 22.

Images reconstructed by the data processing server 22 are conveyed back to the workstation 10 where they are stored. Real-time images are stored in a data base memory cache (not shown) from which they may be output to operator display 12 or a display 42 which is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 2:
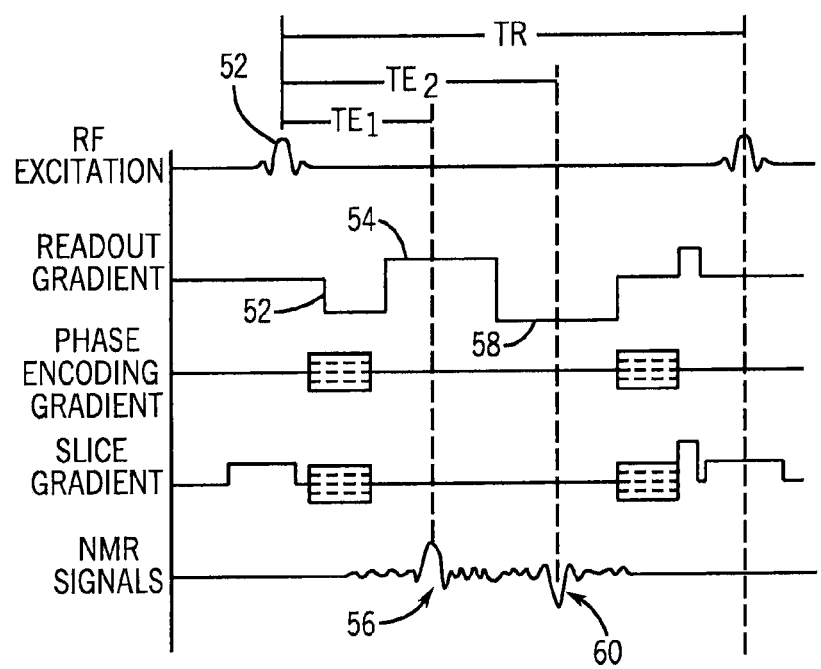
FIG. 2 is an embodiment of a pulse sequence that directs the operation of the MRI system of FIG. 1 to acquire water and fat images.

The MRI system of FIG. 1 can perform many different pulse sequences to produce images and spectroscopic information. The present invention relates to the removal of artifacts that occur due to chemical shifts. In one embodiment, when a particular situation is present in the prescribed pulse sequence, subsequent image processing in k-space removes these artifacts. In another embodiment, a generalized removal of artifacts in k-space is described. One such situation is present when the pulse sequence shown in FIG. 2 is prescribed and two images are reconstructed and combined such that either a water or fat image or both are produced. Many other situations are possible that produce the artifacts that are corrected using the present invention.

Referring particularly to FIG. 2, a pulse sequence that enables separate water and fat images to be produced is shown. After an rf excitation pulse 50 is generated to tip longitudinal magnetization into the transverse plane a negative dephasing lobe 52 is produced along the readout gradient axis, followed by a positive readout gradient lobe 54, which induces a first gradient-echo NMR signal 56. The timing is selected such that the echo time $TE_1$ of this first NMR signal 56 is set to the point in time when the water and fat signal components in the signal 56 are 180° out of phase. In a 1.5 T system this is 2.3 msec. As is well known in the art the NMR signal 56 samples k-space along a line oriented in the same direction as the readout gradient. Exactly where that sampling trajectory is located in k-space is determined by the phase encoding gradient and slice gradient applied during the pulse sequence as is also well known in the art.

The polarity of the readout gradient is then reversed and a second readout gradient lobe 58 is produced to again rephase the transverse magnetization and produce a second gradient-echo NMR signal 60. Because the phase encodings have not changed, the second NMR signal 60 samples along the same, linear k-space sampling trajectory, but it does so in the opposite direction. The echo time $TE_2$ of the second NMR signal 60 is set such that fat and water spins are in-phase. At 1.5 T this is 4.6 msec. The pulse sequence of FIG. 2 is repeated with different phase encodings to sample throughout k-space and produce two separate k-space data sets $S_0$ and $S_1$ from which fat/water in-phase and 180° out-of-phase images can be reconstructed.

If the center frequency of the rf excitation pulse 52 is set to the Larmor frequency of water, the fat signal will be shifted a small amount in the reconstructed image along the readout gradient axis direction due to chemical shift. The amount of this chemical shift ($\Delta x$) measured in image pixels is:

$$\Delta x = N_x \Delta f / 2BW,$$

where:
 $\Delta f$=chemical shift between water and fat which is about −210 Hz at 1.5 T;
 $N_x$=number of k-space samples acquired during the readout; and
 BW=readout bandwidth which is typically ±20 to 125 kHz.

Importantly, this chemical shift of fat signal occurs in one direction from the water signal when the readout gradient is positive, and the fat signal is shifted by the same amount in the opposite direction from the water signal when the readout gradient is negative. As a result, the fat signal in the two images acquired as described above will not only be chemically shifted $\Delta x$ from the water signal, but they are chemically shifted $2\Delta x$ from each other.

Figure 3:
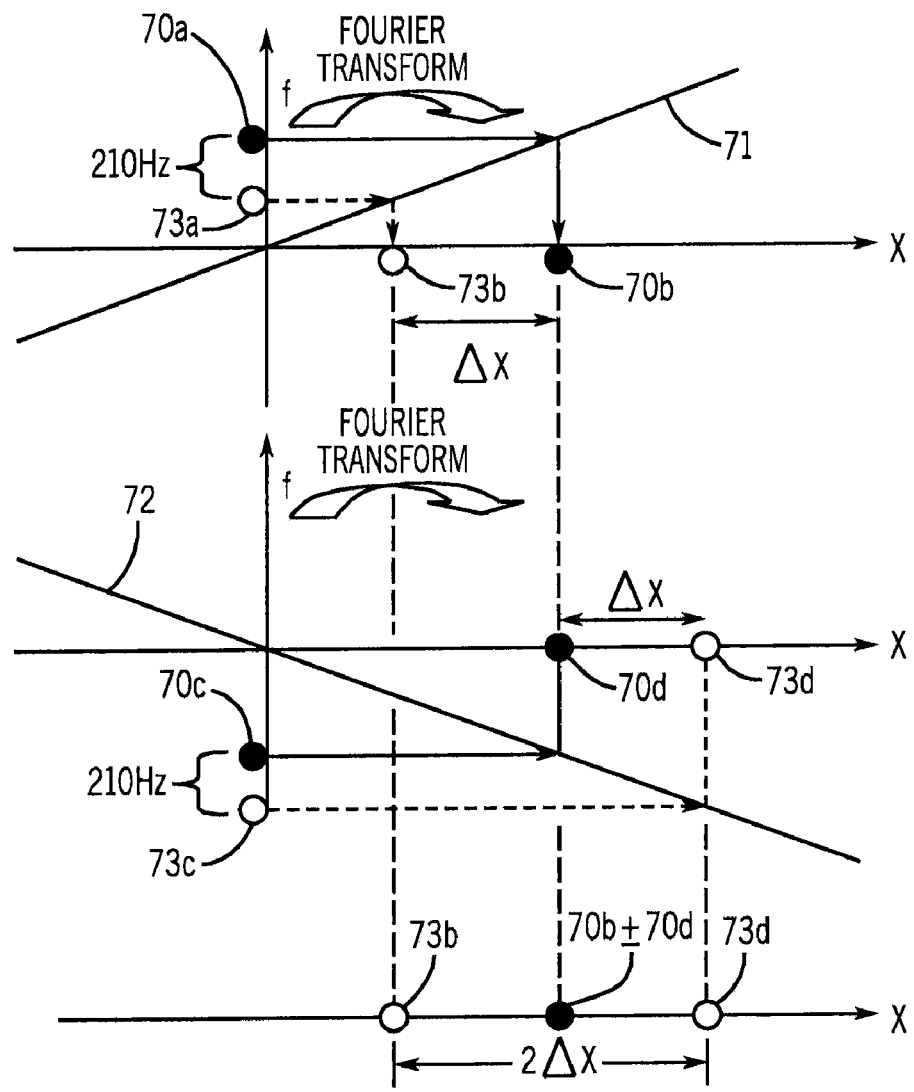
FIG. 3 is a graphic illustration of the misalignment in the signals acquired with the pulse sequence of FIG. 2.

This misalignment of the fat signals in the two reconstructed images is illustrated in FIG. 3. In this example, the center RF excitation is set to the Larmor frequency of water and water spin signal 70a at a particular frequency f is located along the readout axis x at a correct position 70b by the Fourier transformation when in the presence of a positive readout gradient 71. Similarly, the signal 70c produced by the same water spins during the application of a negative readout gradient 72 of the same magnitude will correctly position those spins at location 70d along the readout axis x. The water signals are thus correctly aligned in both images.

The fat signals are off resonance by a small amount (−210 Hz at 1.5 T and −420 Hz at 3.0 T) and they are not properly positioned along the readout gradient axis by the Fourier transformation. When the positive gradient 71 is applied, fat spins at the same location produce a slightly lower frequency signal 73a and this Fourier transformation mispositions the fat spins at position 73b which is $\Delta x$ to one side of the water spins 70b. The same fat spins produce a signal 73c that is positioned $\Delta x$ to the other side of the water spins 70d at location 73d when the negative readout gradient 72 is produced. As a result, when the two reconstructed images are combined the aligned water spins 70b and 70d correctly indicate spin density at each location along the readout axis x, but the fat signals 73b and 73d are shifted by an amount $2\Delta x$ from each other.

Figure 4:
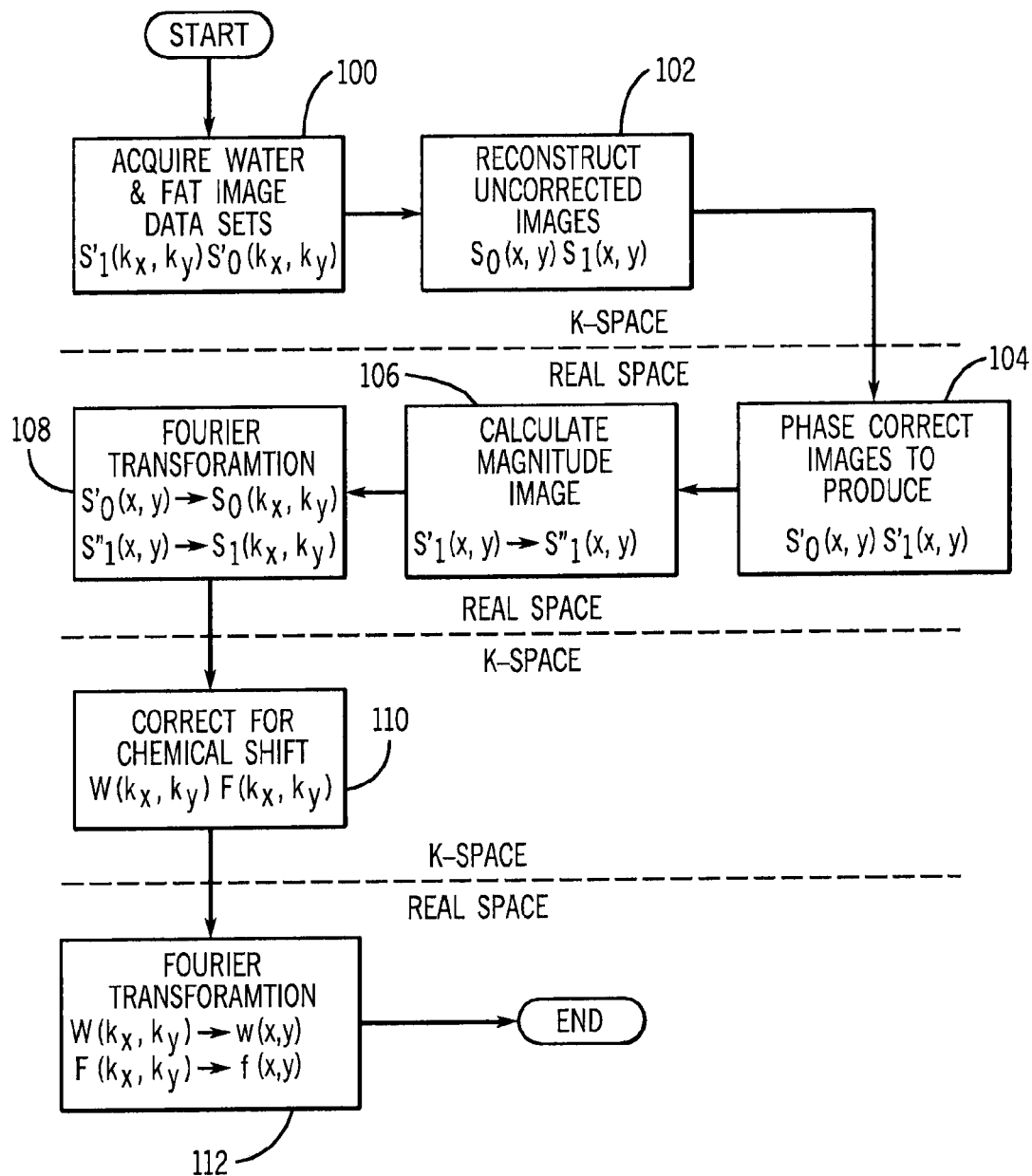
FIG. 4 is a flow chart of the method used to acquire the two images using the pulse sequence of FIG. 2.

Referring particularly to FIG. 4, one embodiment of the present invention is employed in a water/fat imaging procedure in which two images are acquired with the pulse sequence in FIG. 2 as indicated at process block 100. The center frequency of the rf excitation pulse 52 is set to that of water and two k-space data sets $S_1'$ and $S_0'$ are acquired at the prescribed scan parameters.

Two images $s_o$ and $s_i$ are reconstructed from these acquired k-space data sets by performing an inverse Fourier transformation as indicated at process block 102.

Both images are then phase corrected as indicated by process block 104. This is accomplished by dividing the phase at each image pixel in the $s_o(x,y)$ image into itself and into the corresponding pixel of the second image $s_1(x,y)$ to produce the two images $s_0'(x,y)$ and $s_1'(x,y)$ as set forth above in equations (4) and (5). As indicated at process block 106 the magnitude of the phase corrected image $s_1'(x,y)$ is then calculated as described above to produce the image $s_1''(x,y)$ as set forth above in equation (6).

The two corrected images are then transformed back to k-space as indicated at process block 108. This is a Fourier transformation along the readout gradient axis for the purpose of the present invention, although all the axes can be transformed to produce the k-space data sets of equations (7) and (8).

The chemical shift corrections are now made as indicated at process block 110 by calculating the final water k-space data set $W(k_x,k_y)$ according to the above equation (9) and calculating the final fat k-space data set $F(k_x,k_y)$ according to the above equation (10). These two data sets are then inverse Fourier transformed as indicated by process block 112 to produce the final water image $w(x,y)$ and final fat image $f(x,y)$.

Figure 5:
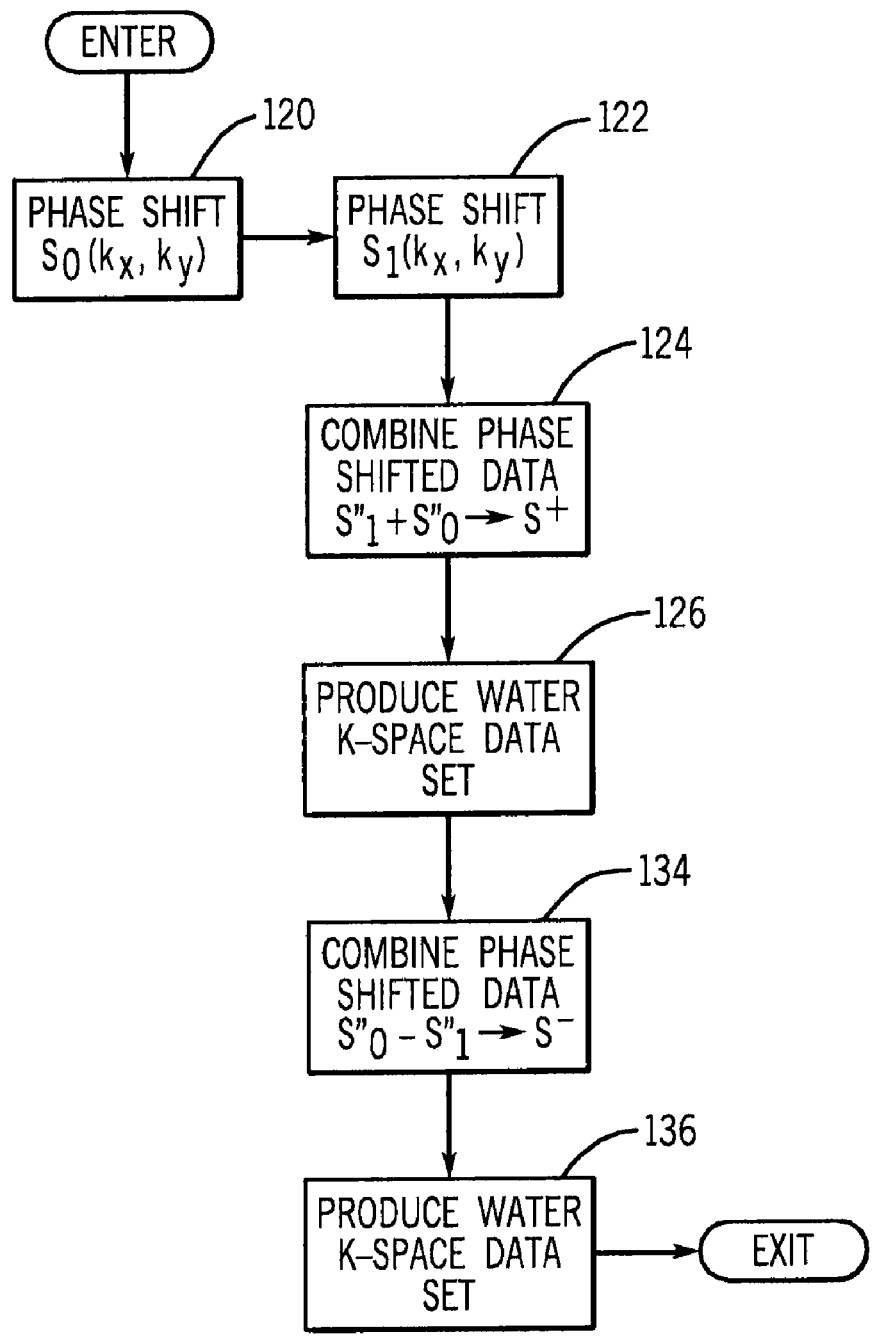
FIG. 5 is a flow chart for calculating a water image k-space data set and a fat image k-space data set.
Figure 6A:
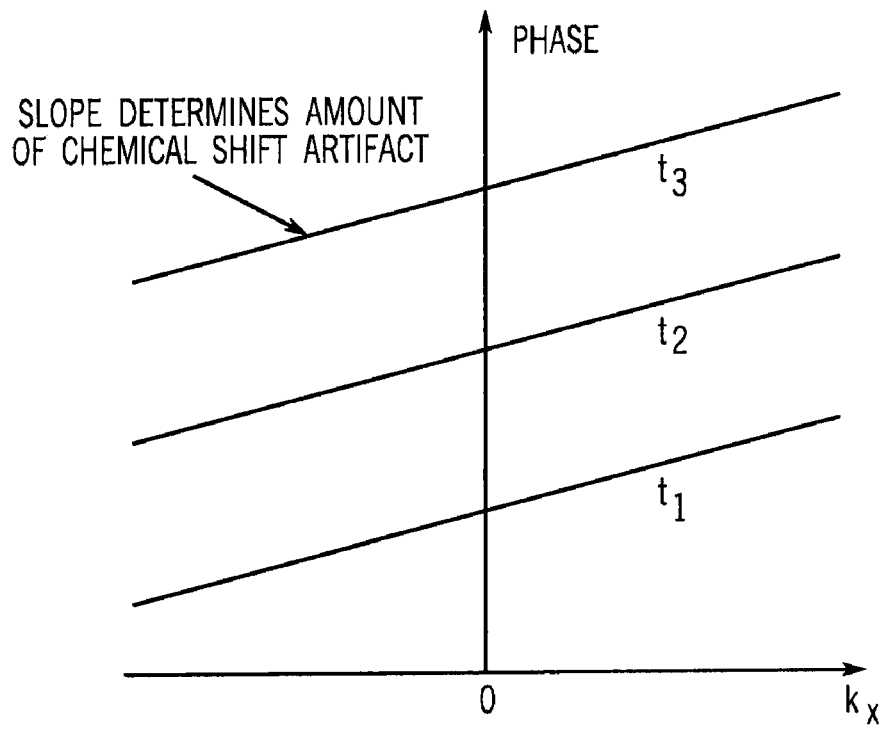
FIGS. 6(a) and 6(b) are diagrams showing the phase evolution of fat signal for spin-warp imaging and echo-planar imaging respectively.
Figure 6B:
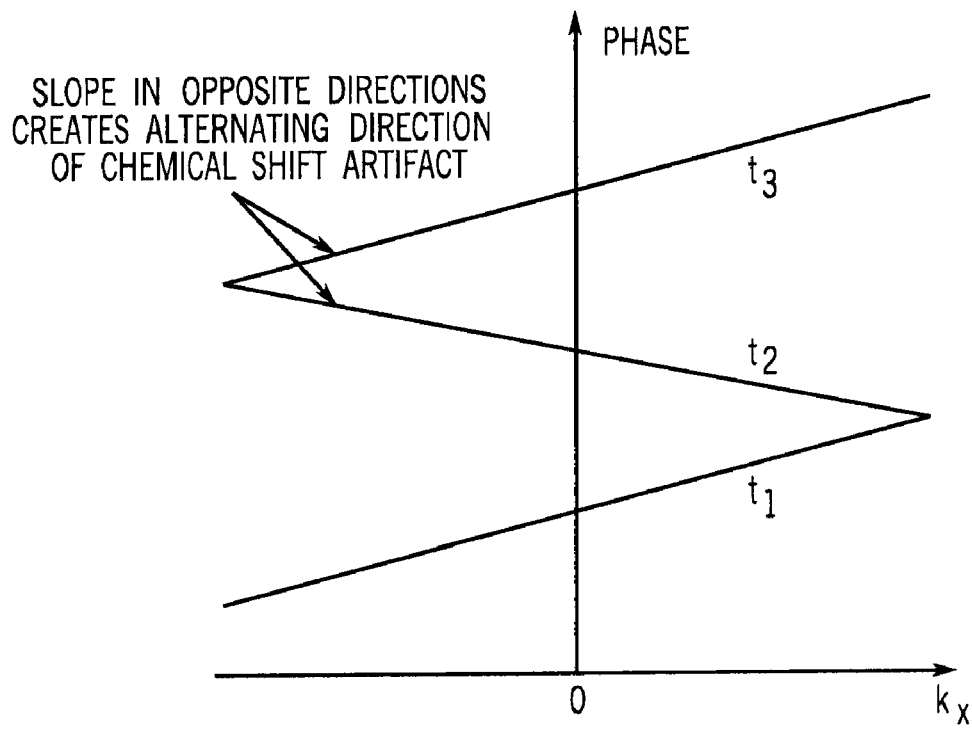
Figure 7A:
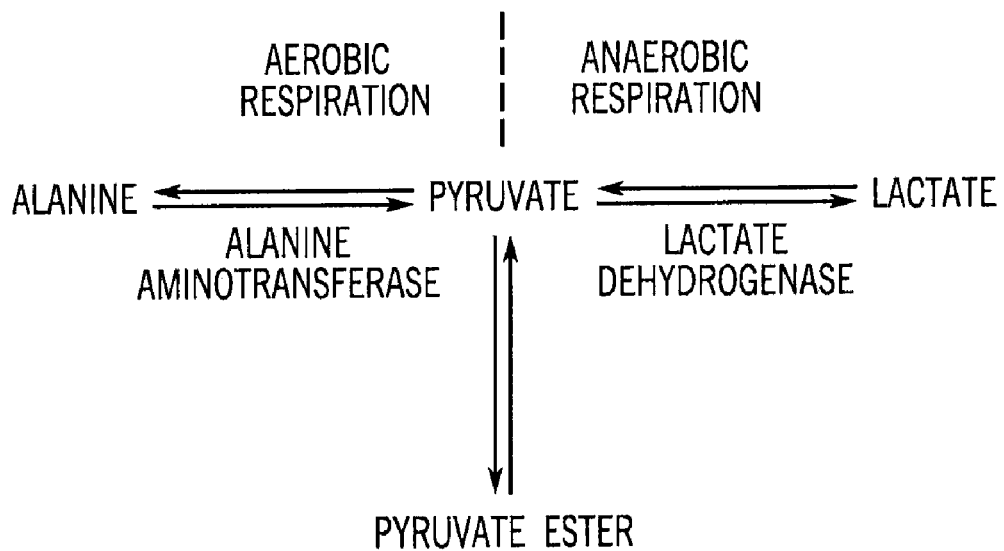
FIG. 7(a) is a schematic of biochemical pathways of labeled pyruvate in both aerobic and anaerobic respiration.
Figure 7B:
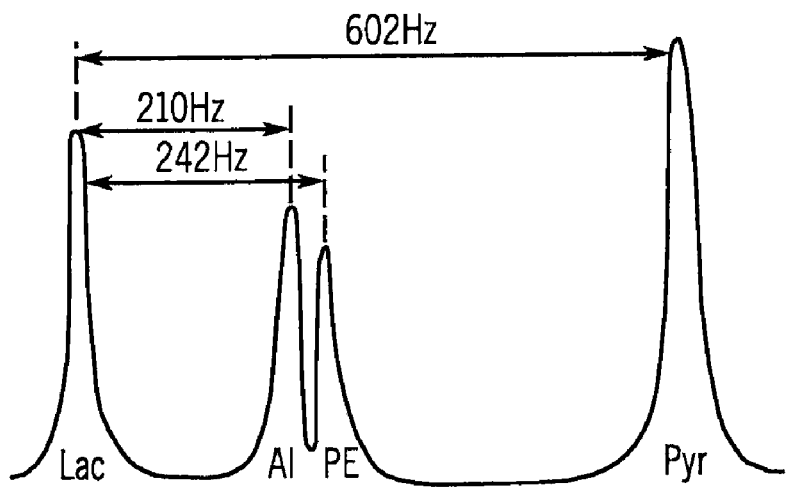
FIG. 7(b) is a schematic of $^{13}$C spectrum for lactate (Lac), alanine (Ala), and pyruvate (Pyr and PE), with the labeled frequency shifts relative to lactate at 3.0 T.

The calculation of the water image k-space data set according to equation (9) and the fat image k-space data set according to equation (10) is depicted in FIG. 5. As indicated at process blocks 120 and 122, the first steps are to phase shift the k-space data sets $S_0(k_x, k_y)$ and $S_1(k_x, k_y)$. More specifically, the phase shifted data set $S_0''$ is produced by phase shifting each $k_y$ row of k-space data by multiplying by: $e^{-i\Delta x \Delta X k_x}$.

Similarly, the phase shifted data set $s_1''$ is produced by multiplying by: $e^{i\Delta x \Delta X k_x}$.

As indicated by process block 124 the two phase shifted data sets $S_1''$ and $S_0''$ are then added together to produce a k-space data set $S^+(k_x, k_y)$, and the water image k-space data set $W(k_x, k_y)$ is produced at process block 126 by dividing the values therein by $2\cos(\Delta x \Delta X k_x)$.

As indicated at process block 134, the two phase shifted data sets $S_0''$ and $S_1''$ calculated above are then combined by subtracting the values in $S_1''$ from corresponding values in $S_0''$ to form a difference k-space data set $S^-(k_x, k_y)$. As indicated at process block 136, the fat image k-space data set $F(k_x, k_y)$ is then produced by dividing the values therein by $2\cos(\Delta x \Delta X k_x)$.

It should be apparent that unlike prior methods for producing separate images of two chemical species, the combination of the two acquired data sets is performed in k-space rather than image space. This enables the correction of chemical shift artifacts due to the alternating polarity of the readout gradient to be made.

Although water and fat images are produced in the preferred embodiment of the invention, it should be apparent that the present invention is applicable to other clinical applications in which two or more images acquired with readout gradients of opposite polarity are to be combined.

It should be noted that the approach described above can be modified for two additional considerations. First, the details of these correction methods are described for situations where the center frequency of the scanner is set to water. Although this is the typical scenario, the center frequency can be set to other frequencies, including fat, or in between water and fat. In these cases, the phase shifts used to correct for shifting of the fat images acquired with the two gradient polarities can be modified and applied to $s_0$ and $s_1$ appropriately to ensure that water and fat images are correctly aligned. A bulk frequency shift is a simple modification of the above analysis.

Similarly, there can be local off-resonance effects that create an effective local shift in the center frequency. This effect is caused by susceptibility and other off-resonance effects that create a "field inhomogeneity map" across the image. The field map, $\psi$, is measured in Hz, and creates time dependent phase shifts that can lead to a spatial shift on both water and fat that will be equal and opposite for images acquired with opposite gradient polarities. Most chemical shift imaging methods measure the local field map, $\psi$, providing an opportunity to correct for the local misalignments of images acquired with opposite gradient polarities due to spatial distortions from the local field inhomogeneities. In situations where the field map is known, its effects may be removed by approaches very similar to those described above, albeit somewhat more complex in mathematics, but very similar in principle.

Figure 8:
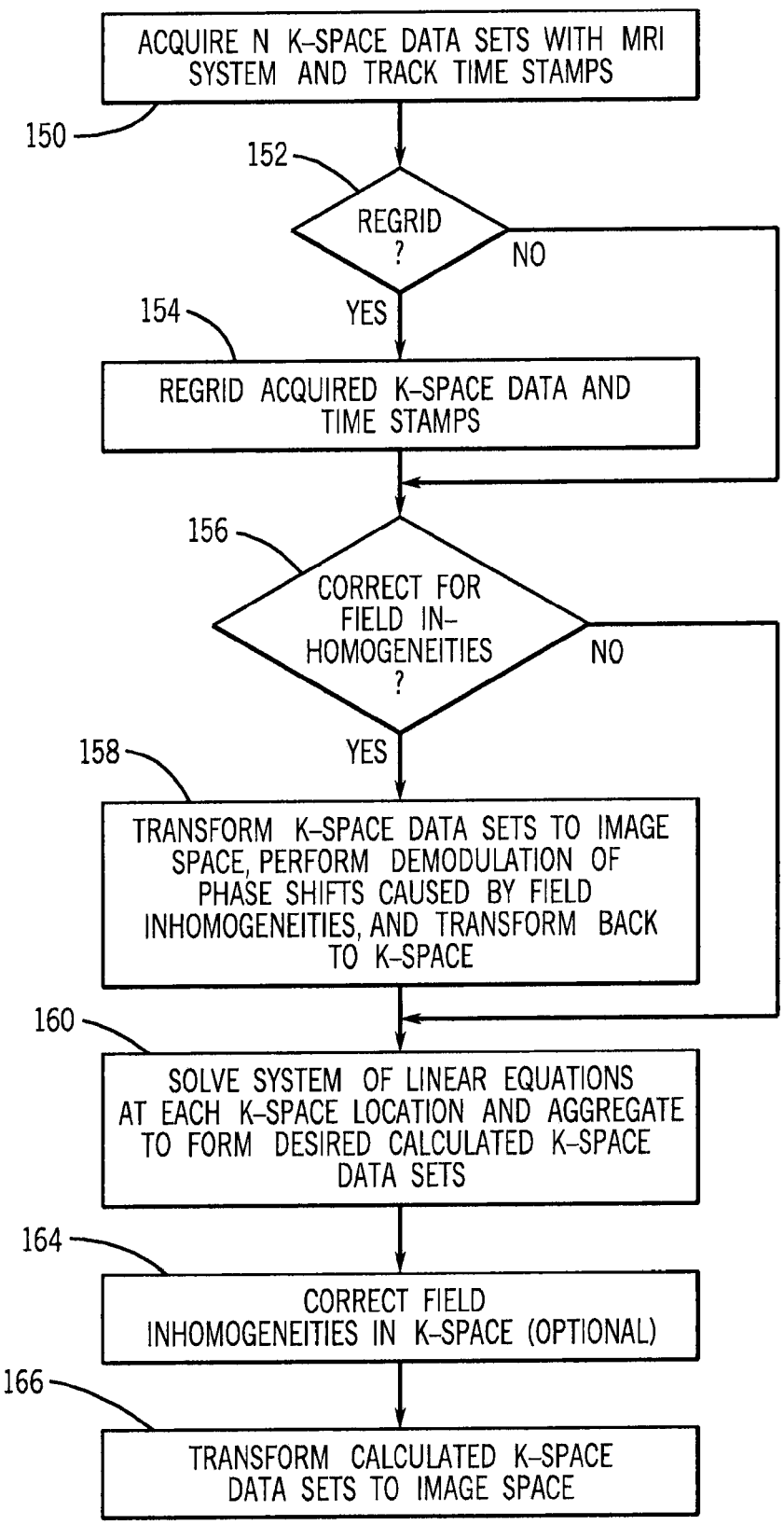
FIG. 8 is a flow chart of a generalized method to perform a chemical shift artifact correction in k-space in order to decompose various chemical species in k-space, to obtain in-phase or out-of-phase species combination data sets in k-space, and/or to separate effects for species with multiple resonant peaks.

Referring now to FIG. 8, illustrated is a generalized method for producing desired calculated k-space data sets which can then be transformed to produce desired images. This method can be used to decompose different spin species, produce species combinations such as in-phase or out-of-phase data sets, and/or account for species with more than one resonant peak.

As indicated at process block 150, a number N of k-space data sets of the sample are acquired with the MRI system, using any of a plurality of pulse sequences to sample k-space using Cartesian or non-Cartesian coordinate sampling trajectories. Preferably, the center frequency of the RF excitation pulse is set to that of one of the chemical species being decomposed. The MRI system also keeps track of the time stamps $\tau_{k,n}$ corresponding to each k-space location of the acquired k-space data set.

As indicated at process block 152, a decision is made whether regridding of the acquired k-space data sets should be performed. If so, such as is the case with non-Cartesian coordinate k-space data, processing proceeds to process block 154. If not, processing proceeds to process block 156.

At process block 154, the acquired k-space data sets are regridded using conventional regridding algorithms to obtain k-space data at Cartesian coordinates. Also, the time stamps $\tau_{k,n}$ associated with each non-Cartesian k-space point are also regridded using the same kernel as for the k-space data to obtain regridded time stamps $\tau'_{k,n}$. The regridded time stamps $\tau'_{k,n}$ will then be used in the system of linear equations, and specifically in the definition of $d_{mn}$ defined by Equation 14(b).

At process block 156, a decision is made whether to correct for field inhomogeneities. If so, processing proceeds to process block 158. If not, processing proceeds to process block 160.

At process block 158, it is assumed that a field inhomogeneity map $\psi$ is available or can be estimated, such as by using a conventional IDEAL algorithm as described in U.S. Pat. No. 7,176,683. The field map $\psi$ can be smoothed to improve the SNR performance of its estimation, as it is generally assumed that the field map varies smoothly in the image.

The details of process block 158 will be discussed in the context of a water and a fat decomposition. Starting with equation (19) above, a magnetic field inhomogeneity map $\psi$ (Hz) in image space will produce an effect at each individual image pixel that can be approximated by:

$$S_n(r) = (W(r) + F(r)e^{i2\pi\Delta f_m t_n})e^{i2\pi\psi t_n};$$

where the effects of chemical shift on blurring, misregistration, etc. are ignored. Generally, the assumption that the field inhomogeneity map is smoothly varying is a good one. Thus, the N acquired k-space data sets (or the regridded k-space data sets) are transformed into image space preferably using an inverse Fourier transform to produce N complex raw images. The raw images are corrected for field inhomogeneities in image space. In particular, the phase shifts caused by the field map are demodulated in image space to produce N demodulated images, according to:

$$S'_n(r) = S_{n(r)} e^{-i2\pi\psi t_n}$$

Next, the N demodulated images are transformed back to k-space using a Fourier transform:

$$s'_n(\tau_{k,n}, k) = FT\{S'_n(r)\} = w(k) + f(k)e^{i2\pi\Delta f_m (t_n + \tau_{k,n})}$$

Thus, prior to process block 160, N k-space data matrices, $s_n(\tau_{k,n}, k)$ or $s'_n(\tau_{k,n}, k)$ have been obtained, each having corresponding k-space data at each of a plurality of Cartesian k-space locations. Note that if regridding is not performed and field inhomogeneity correction is not desired, then the N k-space data matrices can simply be the N acquired k-space data sets.

At process block 160, a system of linear equations, which relates corresponding data from each of the N k-space data matrices, echo times and time stamps ($\tau_{k,n}$ or $\tau'_{k,n}$) to desired calculated k-space data, is solved at each of the plurality of Cartesian k-space locations of the obtained k-space data matrices. The calculated k-space data from all k-space locations is aggregated to obtain a complete calculated k-space data set.

Specifically, the system of linear equations can be formulated in various ways. For example, the system of linear equations can be represented by equation (14), equation (15), or simplifications thereof, and in this manner, separate species k-space data can be determined. In other embodiments, the system of linear equations to be solved can be represented instead by equation (23), such that in-phase species combination k-space data can be produced. Similarly, the system of linear equations to be solved can be represented by equation (24), and one can obtain out-of-phase series combination k-space data. Additionally, the system of linear equations can be formulated according to equation (25) or a similar manner to decompose $^{13}$C labeled metabolites, including separating multiple peaks of a species. In all these cases, the decompositions and chemical shift artifact corrections are performed in k-space rather than image space.

It is important to note that if the time stamps have been regridded to Cartesian coordinates, the regridded time stamps are used in the system of linear equations, and specifically in the definition of $d_{mn}$, defined by equation 14(b).

Process block 164 is an optional step, wherein field inhomogeneities can be corrected in k-space using an acquired field inhomogeneity map, according to procedures such as the multi-frequency approach described by Nayak et al. in the article titled "Automatic field map generation and off-resonance correction for projection reconstruction imaging" at Magn Reson Med 2000; 43(1);151-154; or "Efficient off-resonance correction for spiral imaging" at Magn Reson Med 2001; 45(3):521-524. These methods can be applied to separate species k-space data sets to produce corrected separate species k-space data sets which will produce images with reduced distortion/blurring caused by the field inhomogeneity. These corrected separate species k-space data sets will then be transformed at process block 166.

At process block 166, the calculated k-space data sets from process block 162 or 164 are transformed to image space such as by using an inverse Fourier transform. In the case of separate species k-space data sets, separate species images are produced, such as separate water images and fat images. In the case of species combination k-space data sets, in phase or out of phase images are produced.

It should be apparent that unlike prior methods for producing separate images of two chemical species, the correction for chemical shift artifact is performed in k-space rather than image space. Although water and fat images are produced in one preferred embodiment of the invention, it should be apparent that the present invention is applicable to other applications as well.

In other embodiments, the order of the process blocks illustrated in FIG. 8 can be varied. For example, for a non-Cartesian acquisition, if it is not desired that the field inhomogeneity map be solved for in image space, then it is possible to perform the regridding of process block 152 after the desired calculated k-space data sets are produced in process block 160 (and prior to performing process block 166). This can be advantageous in that the number of computationally intensive regridding calculations can be reduced when the number N of acquired k-space data sets is greater than the number M of separate species. For example, if N=6 and water and fat are being separated (i.e., M=2), it would be advantageous to perform regridding of the two separated species k-space data sets rather than perform regridding of the six acquired k-space data sets.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing images of a subject containing M spin species using a magnetic resonance imaging (MRI) system, the steps comprising:
    a) obtaining N k-space data matrices from N k-space data sets each acquired with the MRI system using a pulse sequence with an individual associated echo time $t_n$, the N k-space data matrices each including corresponding data at the same plurality of Cartesian k-space locations;
b) obtaining a time stamp corresponding to each of the plurality of k-space locations, wherein the time stamp is an indication of when corresponding data is acquired relative to a reference;
c) for each k-space location, solving a system of linear equations in k-space to produce desired calculated k-space data which is corrected for chemical shift, the system of linear equations relating corresponding data from the N k-space data matrices, echo times and time stamps to the desired calculated k-space data;
d) aggregating the calculated k-space data associated with the plurality of k-space locations to obtain a calculated k-space data set; and
e) transforming the calculated k-space data set to image space to obtain a corresponding image.

2. The method of claim 1 wherein solving the system of linear equations includes performing a maximum likelihood estimation.

3. The method of claim 2, wherein performing the maximum likelihood estimation includes the calculation of a pseudo-inverse of a matrix $A_{k,n}$ which includes phase shift information due to echo times and time stamps.

4. The method of claim 1, wherein the calculated k-space data sets include at least one separate species k-space data set.

5. The method of claim 1, wherein the calculated k-space data sets include one of an in-phase and an out-of-phase species combination k-space data set.

6. The method of claim 1, wherein the system of linear equation separates resonant peaks of a species with more than one resonant peak.

7. The method of claim 1, wherein step a) includes regridding the acquired k-space data sets.

8. The method of claim 7, wherein step b) includes regridding non-Cartesian time stamps corresponding to the acquired k-space data sets.

9. The method of claim 7, wherein step a) includes transforming the N regridded k-space data sets to image space to produce N raw images, correcting the raw images for field inhomogeneities in image space to produce N corrected images, and transforming the corrected images to k-space to produce the N k-space data matrices.

10. The method of claim 1, wherein step a) includes transforming the N acquired k-space data sets to image space to produce N raw images, correcting the raw images for field inhomogeneities in image space to produce N corrected images, and transforming the corrected images to k-space to produce the N k-space data matrices.

11. The method of claim 10, wherein correcting the raw images for field inhomogeneities in image space includes performing a demodulation on the N raw images using a field inhomogeneity map.

12. A method for producing images of a subject containing M spin species using a magnetic resonance imaging (MRI) system, the steps comprising:
a) obtaining N k-space data matrices from N k-space data sets each acquired with the MRI system using a pulse sequence with an individual associated echo time $t_n$, where $n=1, \ldots, N$ and $N \geq M$; wherein the k-space data matrices each include corresponding data at the same plurality of Cartesian k-space locations;
b) obtaining a time stamp corresponding to each of the plurality of k-space locations, wherein the time stamp is an indication of data acquisition time relative to a reference;
c) for each k-space location, solving a system of linear equations in k-space to produce separate series k-space data which is corrected for chemical shift, the system of linear equations relating corresponding data from the N k-space data matrices, echo times and time stamps to the separate species k-space data;
d) aggregating the separate species k-space data associated with the plurality of k-space locations to obtain separate species k-space data sets; and
e) transforming at least one of the separate species k-space data sets to image space to obtain at least one corresponding separate species image.

13. The method of claim 12, wherein step a) includes regridding the acquired k-space data sets, which are acquired using non-Cartesian coordinate sampling trajectories.

14. The method of claim 13, wherein step b) includes regridding non-Cartesian time stamps corresponding to the acquired k-space data sets.

15. The method of claim 14, wherein step a) includes transforming the N regridded k-space data sets to image space to produce N raw images, correcting the raw images for field inhomogeneities in image space to produce N corrected images, and transforming the corrected images to k-space to produce the N k-space data matrices.

16. The method of claim 12, wherein step a) includes transforming the N acquired k-space data sets to image space to produce N raw images, correcting the raw images for field inhomogeneities in image space to produce N corrected images, and transforming the corrected images to k-space to produce the N k-space data matrices.

17. The method of claim 16, wherein correcting the raw images for field inhomogeneities in image space includes performing a demodulation on the N raw images using a field inhomogeneity map.

18. The method of claim 12, wherein step c) includes solving the equation $\hat{\rho} = (A_{k,n}{}^H A_{k,n})^{-1} A_{k,n}{}^H S_k$ at each Cartesian k-space location; wherein $\hat{\rho} = [\rho_1 \rho_2 \ldots \rho_M]$ represents the M separate species k-space data at that k-space location;

$$S_k = \begin{bmatrix} s_1 \\ s_2 \\ \ldots \\ s_N \end{bmatrix}$$

represents the corresponding data from the N obtained k-space data matrices;

$$A_{k,n} = \begin{vmatrix} c_{11}d_{11}(k) & c_{21}d_{21}(k) & \cdots & c_{M1}d_{M1}(k) \\ c_{12}d_{12}(k) & c_{22}d_{22}(k) & \cdots & c_{M2}d_{M2}(k) \\ \ldots & \ldots & \ldots & \ldots \\ c_{1N}d_{1N}(k) & c_{2N}d_{2N}(k) & \cdots & c_{MN}d_{MN}(k) \end{vmatrix};$$

wherein $c_{mn} = e^{i2\pi\Delta f_m t_n}$; $d_{mn}(k) = e^{i2\pi\Delta f_m \tau_{k,n}}$; and $\tau_{k,n}$ is a time stamp.

19. The method of claim 12, wherein after step d), the separate species k-space data sets are corrected for field inhomogeneities in k-space and step e) is performed using at least one of the corrected separate species k-space data sets.

20. A method for producing images of a subject containing two spin species using a magnetic resonance imaging (MRI) system, the steps comprising:

a) obtaining N k-space data matrices from N k-space data sets each acquired with the MRI system using a pulse sequence with an individual associated echo time $t_n$, where n=1, ..., N, and N≧2; wherein the k-space data matrices each include corresponding data at the same plurality of Cartesian k-space locations;

b) obtaining a time stamp corresponding to each of the plurality of k-space locations, wherein the time stamp is an indication of when corresponding data is acquired relative to a reference;

c) for each k-space location, solving a system of linear equations in k-space to produce species combination k-space data which is corrected for chemical shift, the system of linear equations relating corresponding data from the N k-space data matrices, echo times and time stamps to the species combination k-space data;

c) aggregating the species combination k-space data associated with the plurality of k-space locations to obtain a species combination k-space data set; and d) transforming the species combination k-space data set to image space to obtain one of an in-phase and an out-of-phase species combination image.

21. The method of claim 20, wherein step a) includes regridding the acquired k-space data sets.

22. The method of claim 21, wherein step b) includes regridding non-Cartesian time stamps corresponding to the acquired k-space data sets.

23. The method of claim 20, wherein step a) includes transforming the N acquired k-space data sets to image space to produce N raw images, correcting the raw images for field inhomogeneities in image space to produce N corrected images, and transforming the corrected images to k-space to produce the N k-space data matrices.

24. The method of claim 23, wherein correcting the raw images for field inhomogeneities in image space includes performing a demodulation on the N raw images using a field inhomogeneity map.

25. The method of claim 20, wherein step a) includes regridding the acquired k-space data sets to produce regridded k-space data sets, transforming the regridded k-space data sets to image space to produce N raw images, correcting the raw images for field inhomogeneities in image space to produce N corrected images, and transforming the corrected images to k-space to produce the N k-space data matrices.

26. The method of claim 20, wherein step c) includes solving the equation:

$$\hat{\rho} = (A_{k,n}{}^H A_{k,n})^{-1} A_{k,n}{}^H S_k$$

at each Cartesian k-space location, wherein $\hat{\rho}=[(\rho_1+\rho_2)\rho_2]$ represents in-phase species combination data and separate species data at a k-space location;

$$S_k = \begin{bmatrix} s_1 \\ s_2 \\ \ldots \\ s_N \end{bmatrix}$$

represents the obtained k-space data with an element from each of the N k-space data matrices;

$$A_{k,n} = \begin{vmatrix} 1 & (e^{i2\pi\Delta f_m (t_1+\tau_{k,1})} - 1) \\ 1 & (e^{i2\pi\Delta f_m (t_2+\tau_{k,2})} - 1) \\ \ldots & \ldots \\ 1 & (e^{i2\pi\Delta f_m (t_n+\tau_{k,n})} - 1) \end{vmatrix};$$

wherein $\Delta f_m$ is the frequency difference between the two species; and $\tau_{k,n}$ is an obtained time stamp.

27. The method of claim 20, wherein step c) includes solving the equation:

$$\hat{\rho} = (A_{k,n}{}^H A_{k,n})^{-1} A_{k,n}{}^H S_k$$

at each k-space location; wherein $\hat{\rho}=[(\rho_1-\rho_2)\rho_2]$ represents out-of-phase series combination data and separate species data at a k-space location;

$$S_k = \begin{bmatrix} s_1 \\ s_2 \\ \ldots \\ s_N \end{bmatrix}$$

represents the obtained k-space data with an element from each of the N k-space data matrices;

$$A_{k,n} = \begin{vmatrix} 1 & (e^{i2\pi\Delta f_m (t_1+\tau_{k,1})} - 1) \\ 1 & (e^{i2\pi\Delta f_m (t_2+\tau_{k,2})} - 1) \\ \ldots & \ldots \\ 1 & (e^{i2\pi\Delta f_m (t_n+\tau_{k,n})} - 1) \end{vmatrix};$$

$\Delta f_m$ is the frequency difference between the two species; and $\tau_{k,n}$ is an obtained time stamp.

28. The method of claim 20, wherein after step d), the k-space species combination data set is corrected for field inhomogeneities in k-space and step e) is performed on one or more of the corrected combination data set.

29. The method of claim 20, wherein the two spin species are hydrogen associated with water and hydrogen associated with fat.

30. The method of claim 20, wherein k-space data sets are acquired using a pulse sequence with an rf excitation pulse tuned to the Larmor frequency of one of the spin species.

31. A method for producing images of a subject containing two spin species with a magnetic resonance imaging (MRI) system, the steps comprising:

a) acquiring a pair of k-space image data sets using a pulse sequence in which NMR signals ($S_0'$) for one k-space image data set are acquired using a readout gradient of one polarity and NMR signals ($S_1'$) for the other k-space image data set are acquired with a readout gradient of the opposite polarity;

b) reconstructing two images $s_0$ and $s_1$ from the respective k-space data sets $S_0'$ and $S_1'$;

c) removing phase shifts from one or both of the two images $s_1$ and $s_0$ to produce respective images $s_0'$ and $s_1''$;

d) Fourier transforming the two images $s_0'$ and $s_1''$ to k-space;

e) producing from the resulting k-space data sets $S_0$ and $S_1$ a first spin species k-space data set W and a second spin species k-space data set F that are corrected for chemical shift; and f) Fourier transforming the first and second spin species k-space data sets W and F to produce a first spin species image w and a second spin species image f.

32. The method as recited in claim 31 in which the two spin species are hydrogen associated with water and hydrogen associated with fat.

33. The method as recited in claim 31 in which the pulse sequence includes producing an rf excitation pulse tuned to the Larmor frequency of one of said spin species.

34. The method as recited in claim 31 in which step c) includes dividing the phase at each pixel in one of said images $s_1$ or $s_0$ into the corresponding pixel phase of both said one image and the other image.

35. The method as recited in claim 31 in which step e) includes:

e)i) phase shifting the two k-space data sets $S_0$ and $S_1$;

e)ii) adding together the two phase shifted data sets produced in step e)i) to produce a summed k-space data set $S^+$;

e)iii) producing from the summed k-space data set $S^+$ the first spin species k-space data set W;

e)iv) subtracting the two phase shifted data sets produced in step e)i) to produce a difference k-space data set $S^-$; and e)v) producing from the difference k-space data set $S^-$ the second spin species k-space data set F.

* * * * *